United States Patent
Liao et al.

(10) Patent No.: US 12,532,546 B2
(45) Date of Patent: Jan. 20, 2026

(54) METHODS FOR REDUCTION OF PHOTORESIST DEFECT

(71) Applicant: TAIWAN SEMICONDUCTOR MANUFACTURING COMPANY, LTD., Hsinchu (TW)

(72) Inventors: Chun-Wei Liao, Taoyuan (TW); Hui-Chun Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 497 days.

(21) Appl. No.: 17/199,123

(22) Filed: Mar. 11, 2021

(65) Prior Publication Data

US 2022/0293587 A1    Sep. 15, 2022

(51) Int. Cl.
| H10D 89/60 | (2025.01) |
| G03F 7/00 | (2006.01) |
| G03F 7/20 | (2006.01) |
| G03F 7/40 | (2006.01) |

(52) U.S. Cl.
CPC ......... *H10D 89/814* (2025.01); *G03F 7/0035* (2013.01); *G03F 7/2004* (2013.01); *G03F 7/40* (2013.01)

(58) Field of Classification Search
CPC ....... H01L 21/0274; G03F 7/40; G03F 7/2004
See application file for complete search history.

(56) References Cited

U.S. PATENT DOCUMENTS

| 5,880,019 | A | * | 3/1999 | Hsieh | H01L 21/76804 |
| | | | | | 257/E21.507 |
| 6,730,458 | B1 | * | 5/2004 | Kim | G03F 7/40 |
| | | | | | 430/311 |
| 8,796,666 | B1 | | 8/2014 | Huang et al. | |
| 9,012,132 | B2 | | 4/2015 | Chang | |
| 9,028,915 | B2 | | 5/2015 | Chang et al. | |
| 9,093,530 | B2 | | 7/2015 | Huang et al. | |
| 9,146,469 | B2 | | 9/2015 | Liu et al. | |
| 9,213,234 | B2 | | 12/2015 | Chang | |
| 9,223,220 | B2 | | 12/2015 | Chang | |
| 9,256,133 | B2 | | 2/2016 | Chang | |
| 9,536,759 | B2 | | 1/2017 | Yang et al. | |
| 9,548,303 | B2 | | 1/2017 | Lee et al. | |
| 2011/0159442 | A1 | * | 6/2011 | Ken | H01L 21/76816 |
| | | | | | 430/312 |
| 2015/0125679 | A1 | * | 5/2015 | Ishikawa | C08J 7/123 |
| | | | | | 428/447 |
| 2016/0135274 | A1 | * | 5/2016 | Fischer | H01J 37/32449 |
| | | | | | 250/492.2 |

(Continued)

*Primary Examiner* — Lex H Malsawma
*Assistant Examiner* — Bruce R. Smith
(74) *Attorney, Agent, or Firm* — NZ Carr Law Office PLLC (57) ABSTRACT

The present disclosure in various embodiments provides a hardened resist layer that can reduce resist scum defects in a resist layer. In one embodiment, a lithography method is provided. The method includes forming a resist layer over a substrate, performing an exposure process on the resist layer, performing a developing process on the resist layer to form a patterned resist layer having a plurality resist segments, exposing the patterned resist layer to a vacuum ultraviolet (VUV) radiation, and subjecting the resist pattern to a de-scum process.

20 Claims, 5 Drawing Sheets

(56) References Cited

U.S. PATENT DOCUMENTS

| | | | |
|---|---|---|---|
| 2018/0025936 A1* | 1/2018 | Singh | H01L 21/76816 438/618 |
| 2018/0173096 A1* | 6/2018 | Zi | G03F 7/0047 |
| 2019/0067002 A1* | 2/2019 | Su | H01L 21/0337 |
| 2023/0152701 A1* | 5/2023 | Kanakasabapathy | C23C 16/45525 430/273.1 |

* cited by examiner

METHODS FOR REDUCTION OF PHOTORESIST DEFECT

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased.

The decreasing geometry sizes may lead to various manufacturing difficulties. For example, a photoresist is commonly used to pattern layers in semiconductor processes. However, as the device sizes become smaller and smaller, the use of photoresist may cause broken line and/or photoresist scum issues, which may degrade semiconductor device performance or even lead to device failures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-7A are diagrammatic fragmentary top views of a portion of the workpiece during various patterning stages in accordance with embodiments of the method described in FIG. 1.

FIGS. 2B-7B are diagrammatic fragmentary cross-sectional side views of the portion of the workpiece taken along lines 2B-2B, 3B-3B, 4B-4B, 5B-5B, 6B-6B, and 7B-7B of FIGS. 2A-7A, respectively.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
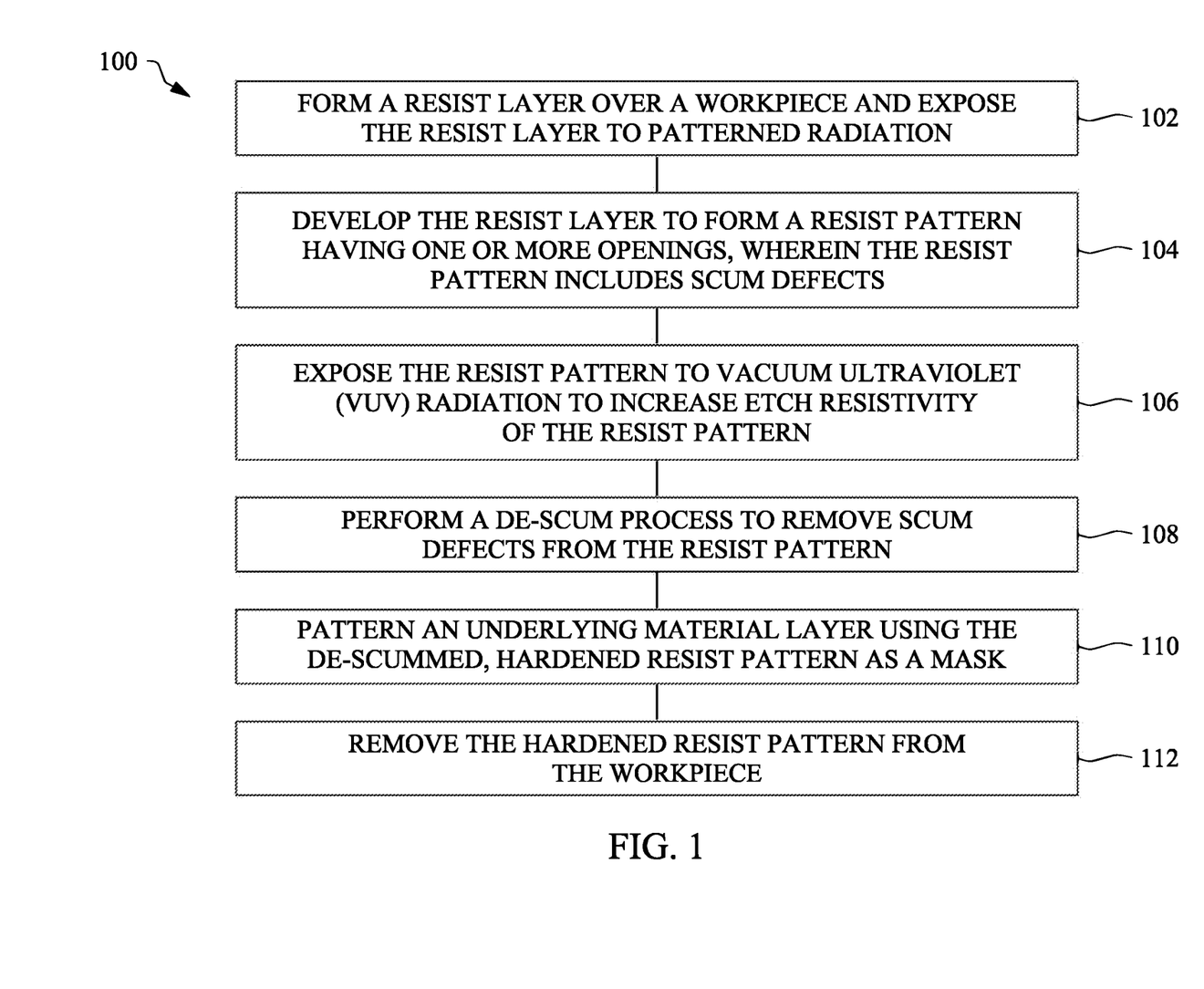
FIG. 1 shows a flowchart of an exemplary method for patterning a workpiece according to embodiments of the present disclosure.

FIG. 1 shows a flowchart of an exemplary method 100 for patterning a workpiece 200 according to embodiments of the present disclosure. It is understood that additional operations can be provided before, during, and after operations shown in FIG. 1, and some of the operations described below can be replaced or eliminated, for additional embodiments of the method. The order of the operations/processes is not limiting and may be interchangeable. FIGS. 2A-7A are diagrammatic fragmentary top views of a portion of the workpiece 200 during various patterning stages in accordance with embodiments of the method 100 described in FIG. 1. FIGS. 2B-7B are diagrammatic fragmentary cross-sectional side views of the portion of the workpiece 200 taken along lines 2B-2B, 3B-3B, 4B-4B, 5B-5B, 6B-6B, and 7B-7B of FIGS. 2A-7A, respectively.

Figure 2A:
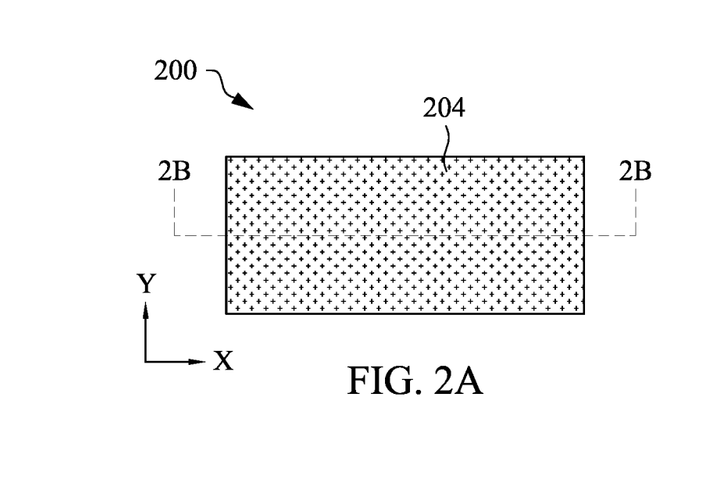
Figure 2B:
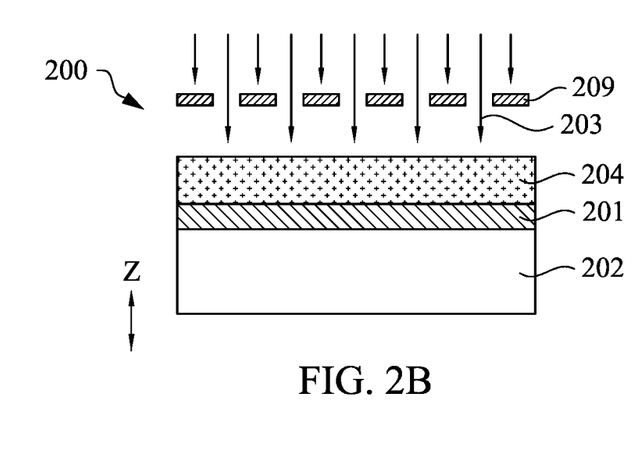

The method 100 starts with an operation 102 in which a lithography process is performed by forming a resist layer 204 over a workpiece 200 and exposing the resist layer 204 to patterned radiation, as shown in FIGS. 2A and 2B. The workpiece 200 is depicted at an intermediate stage of fabrication (or processing) of an IC device, such as a microprocessor, a memory, and/or other IC device. In some embodiments, the workpiece 200 may be a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin-like field effect transistors (FinFETs), nanosheet transistors, other suitable IC components, or combinations thereof. FIGS. 2A-2B to 7A-7B have been simplified for the sake of clarity to better understand the concepts of the present disclosure. Additional features can be added to the workpiece 200, and some of the features described below can be replaced, modified, or eliminated in other embodiments of the workpiece 200.

The workpiece 200 includes a wafer 202, which may be a substrate (for example, a semiconductor substrate), a mask (also referred to as a photomask or reticle), or any base material on which processing may be conducted to provide layers of material to form various features of an IC device. Depending on IC fabrication stage, the wafer 202 may include various material layers (for example, dielectric layers, semiconductor layers, and/or conductive layers) configured to form IC features (for example, doped regions/features, isolation features, gate features, source/drain features (including epitaxial source/drain features), interconnect features, other features, or combinations thereof). In the depicted embodiment, the wafer 202 includes a semiconductor substrate, such as a silicon substrate. Alternatively or additionally, the wafer 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as SiGe, GaAsP, AlAs, AlGaAs, GaInAs, GaInP, and/or GaInAsP; or combinations thereof. Alternatively, the wafer 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

The workpiece 200 also includes a material layer 201 (also referred to herein as an underlying layer) disposed over the wafer 202. The material layer 201 may be a portion of the wafer 202. While the material layer 201 is depicted over the wafer 202, the present disclosure also contemplates embodiments where the material layer 201 is omitted, such that the wafer 202 is directly processed. In some embodiments, the material layer 201 includes a conductive material or a semiconductor material, such as metal or metal alloy. In some embodiments, the metal includes titanium (Ti), aluminum (Al), tungsten (W), tantalum (Ta), copper (Cu), cobalt (Co), ruthenium (Ru), other suitable metal, or combinations thereof. In some embodiments, the metal alloy includes metal nitride, metal sulfide, metal selenide, metal oxide, metal silicide, other suitable metal alloy, or combinations thereof. In some embodiments, the material layer 201 is a hard mask layer to be patterned for use in subsequent processing of workpiece 200. In some embodiments, the material layer 201 is an anti-reflective coating (ARC) layer. In some embodiments, the material layer 201 is a layer to be used for forming a gate feature (for example, a gate dielectric and/or a gate electrode), a source/drain feature (for example, an epitaxial source/drain), and/or a contact feature (for example, a conductive or dielectric feature of a multi-layer interconnect (MLI)) of the workpiece 200. In some embodiments, where the workpiece 200 is fabricated into a mask for patterning IC devices, the wafer 202 can be a mask substrate that includes a transparent material (for example, quartz) or a low thermal expansion material (for example, silicon oxide titanium). In such embodiments, the material layer 201 is a layer to be processed to form an IC pattern therein, such as an absorber layer (for example, material layer 201 includes chromium).

The resist layer 204 may be formed over the workpiece 200 by any suitable process, such as a spin-on coating in which the resist material is deposited on a top surface of a spinning workpiece 200. Rotation of the workpiece 200 causes the resist material to uniformly spread across the top surface of the workpiece 200. The resist layer 204 is also referred to as a photoresist layer, photosensitive layer, imaging layer, patterning layer, or radiation sensitive layer. The resist layer 204 may be a single layer of photoresist or a tri-layer photoresist. An exemplary tri-layer photoresist may include a bottom layer, a middle layer disposed over the bottom layer, and a photosensitive top layer disposed over the middle layer. The bottom layer can include a first $C_xH_yO_z$ material, the middle layer can include a $SiC_xH_yO_z$ material, and the photosensitive top layer can include a second $C_xH_yO_z$ material and a photo-sensitive element.

In the depicted embodiment, the resist layer 204 is formed on a material layer to be processed, such as the material layer 201. The resist layer 204 may have a thickness of about 50 Angstroms to about 30000 Angstroms. Thinner or thicker resist layer 204 may be employed. As will be discussed in more detail below, due to the hardening process to be performed on the resist layer 204, a relatively thin layer of the resist layer 204 may be employed and still provide sufficient etch resistance.

After the formation of the resist layer 204, an exposure process is performed on the resist layer 204 by illuminating the resist layer 204 with patterned radiation 203 emitted from an energy source. The patterned radiation 203 may be formed by projecting light from the energy source through a mask 209. The energy source may emit deep ultraviolet (DUV) light, extreme UV (EUV) light, or electron-beam (e-beam). Depending on the application, the exposure process can be in air, liquid (immersion lithography), or vacuum (for example, when implementing EUV lithography and/or e-beam lithography). In either case, the radiation is patterned using a mask 209 having an IC pattern defined therein, such that the patterned radiation 203 forms an image of the IC pattern on the resist layer 204.

The resist layer 204 may be or include advanced lithography materials, such as chemically amplified resist (CAR) materials. CAR materials can generate multiple chemical reactions upon exposure to radiation and chemically amplify a response to the radiation. CAR materials improve sensitivity of the resist layer 204 to the radiation, thereby maximizing utilization of the radiation. For Deep ultra-violet (DUV) photolithography operating at 248 nm and 193 nm wavelength, for example, the resist layer 204 may be formed from a CAR material includes a polymer that is resistant to an integrated circuit process (such as an etching process), an acid generating component (such as a photoacid generator (PAG)), and a solvent component. The PAG generates acid upon exposure to radiation, which functions as a catalyst for causing chemical reactions that increase (or decrease) solubility of exposed portions of the resist layer. For example, in some embodiments, acid generated from the PAG catalyzes cleaving of acid labile groups (ALGs) bonded (linked) to the polymer, thereby changing solubility of exposed portions of the resist layer. For Extreme ultraviolet (EUV) photolithography operating at 13.5 nm wavelength, for example, the resist layer 204 may be or include metal-containing materials (e.g., metal oxide-based materials). The metal-containing photoresists provide increased absorption of incident EUV photons as well as better etch selectivity, allowing thinner photoresist to be used for patterning.

Figure 3A:
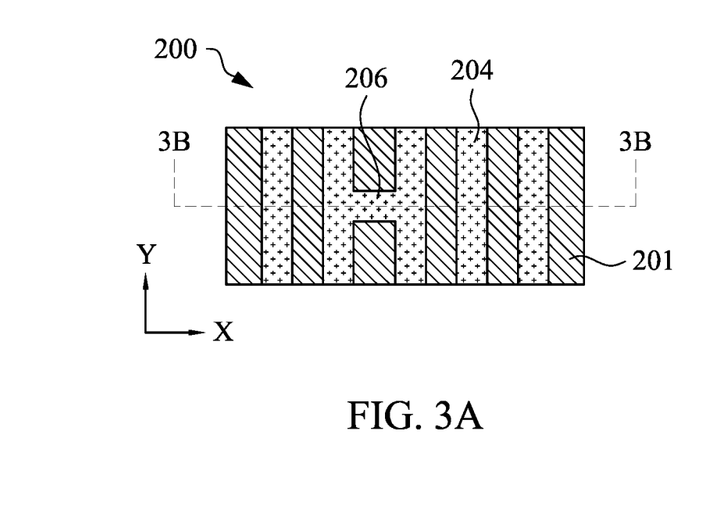
Figure 3B:
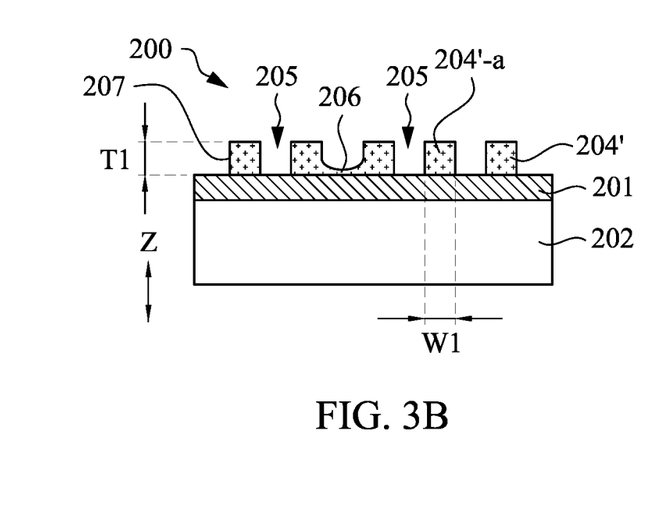

At operation 104, after exposure of the patterned radiation, the resist layer 204 is developed in a developer by immersing the resist layer 204 in a developer (e.g., a chemical solution). The developer selectively removes portions of the resist layer 204 to form a patterned resist layer 204 (referred to herein as a resist pattern 204') having one or more openings 205, as shown in FIGS. 3A and 3B. In some embodiments, the resist pattern 204' may have a thickness T1 of about 130 Angstroms to about 200 Angstroms. The resist pattern 204' is used as a mask during a subsequent process, such as an etching process or an implantation process, to transfer the pattern in the resist pattern 204' into the material layer 201. The exposure may render the resist layer 204 more soluble in the developer, thereby producing a positive-tone image of the mask. Conversely, the resist layer 204 may become less soluble upon exposure, resulting in generation of a negative-tone image of the mask.

While metal-containing photoresists show the advantages in the resolution and patterning capability on the next generation EUV lithography, the patterning and etching processes used during the lithography process may form resist scum due to the small feature size and/or imperfections of the lithography process. FIGS. 3A and 3B illustrate an example of a resist scum 206 protruding from sidewalls 207 of the resist pattern 204'. The resist scum 206 forms a footing that may close one or more of the openings 205. The resist scum 206 decreases the width of the openings 205 in the resist pattern 204' and enlarges the size of the resist pattern 204'. As such, the presence of the resist scum 206 may lead to inaccuracies or other failures in the subsequent patterning processes. While a de-scum process can be used to reduce scum defects, the metal-containing photoresists may be etched by heavier etchants and/or enhanced etching processes which often leads to over-etching of the resist pattern 204'. In some cases, portions of the resist pattern 204' may be etched away in its entirety and result in formation of broken lines of the resist pattern 204'. The broken lines of the resist pattern 204' cannot be properly used to carry out etching of the underlying layer (e.g., the material layer 201). For example, a segment of the underlying layer that should not have been etched is now etched due to the broken lines of the resist pattern 204'. Consequently, semiconductor device performance may be degraded, and device failures may increase.

The present disclosure thus proposes a hardening process to harden a resist pattern (e.g., resist pattern 204'). The hardening process is performed after the developer and prior to the de-scum process. The hardened resist pattern has increased etch resistivity and mechanical strength to withstand heavier or longer etching/de-scum processes without distortion. Therefore, enhanced etching and/or de-scum processes can be applied onto the resist pattern without forming broken line defects in the resist pattern. It has been observed that the scum defects can be reduced by 16%-19% when performing the hardening process between development and de-scum process. Various embodiments of the hardening process (and optional baking process) will be discussed below at operation 106.

At operation 106, the resist pattern 204' is subjected to a hardening process 208. The hardening process may be performed by exposing the resist pattern 204' to an energy source so as to alter physical and/or chemical properties of the resist pattern 204'. As a result, the resist pattern 204' is hardened with increased etch resistivity and mechanical strength. The energy source may be one or more ultraviolet lamps, mercury lamps, excimer lamps, flashlamps, microwave driven lamps, or any suitable lamps. The energy source is configured to produce light or photon radiation with a wavelength of about 400 nm or below, such as from 10 nm to 400 nm. In some embodiments, the energy source produces ultraviolet (UV) light in a wavelength range from 200 nm to 400 nm. In some embodiments, the energy source produces far-UV light in a wavelength range from 10 nm to 200 nm. In some embodiments, the energy source produces vacuum UV (VUV) light with a wavelength of about 200 nm or below, such as from 80 nm to 200 nm.

Figure 4A:
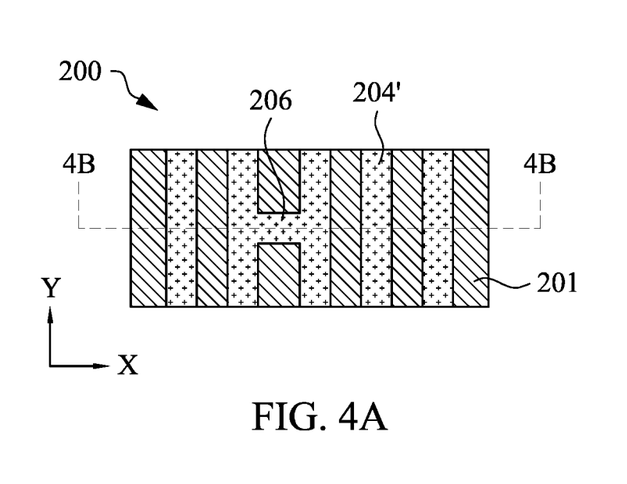
Figure 4B:
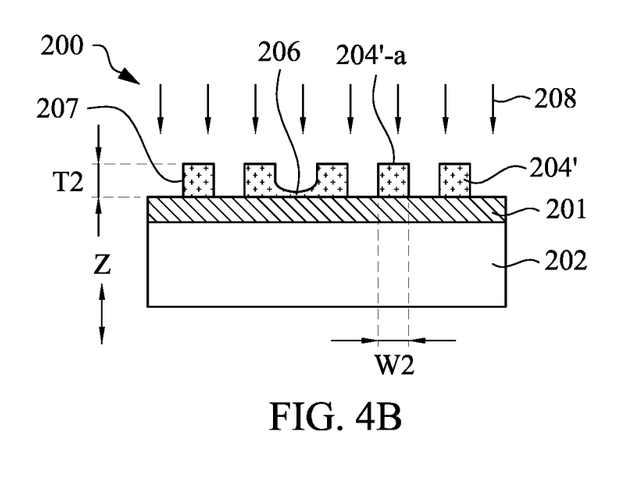

In some embodiments, the hardening process is performed in a vacuum-enabled chamber having any of the above-discussed energy source disposed therein. For example, the energy source may be an excimer lamp emitting UV light at 200 nm to 400 nm wavelength range or far-UV light at 10 nm to 200 nm wavelength range. In most cases, the resist pattern 204' is exposed to UV light, far-UV light, or VUV light under vacuum conditions. In some embodiments, the workpiece 200, the material layer 201, and the resist pattern 204' are exposed to an energy source emitting VUV light 208, as shown in FIGS. 4A and 4B. The VUV light 208 may be generated by striking a plasma formed from a gas mixture including at least an inert gas such as argon, nitrogen, helium, etc. In some examples, the plasma is formed from a gas mixture comprising argon and nitrogen. In some examples, the plasma is formed from a gas mixture comprising argon and neon. In some embodiments, the VUV light 208 is delivered at a wavelength of about 80 nm to about 400 nm (e.g., about 100 nm to about 200 nm), an exposure energy of about 1 millijoule (mJ) to about 800 mJ (e.g., about 100 mJ to about 500 mJ), and an irradiance of about 0.1 mW/cm$^2$ to about 100 mW/cm$^2$ (e.g., about 1 mW/cm$^2$ to about 10 mW/cm$^2$). The exposure time (i.e., the duration of the hardening process) is from about 60 seconds to about 500 seconds (e.g., about 90 seconds to about 180 seconds). The hardening process is performed at a chamber pressure of about 1000 Pa to about 100000 Pa (e.g., about 6000 Pa to about 80000 Pa). It is contemplated that various process parameters are provided in this disclosure for illustration purposes only. The process parameters may vary depending on the size of the workpiece, the thickness of the layers to be treated, and/or the application.

Following the hardening process, the resist pattern 204' (including the workpiece 200 and the material layer 201) is optionally subjected to a baking or anneal process to further harden or condense the resist pattern 204'. In some embodiments, the resist pattern 204' is heated from a first temperature to a second temperature that is higher than the first temperature. For example, the baking or anneal process may heat the resist pattern 204' from about 50 degrees Celsius to about 90 degrees Celsius to a temperature of about 100 degrees Celsius to about 300 degrees Celsius (e.g., about 150 degrees Celsius to about 220 degrees Celsius). The baking or anneal process may be performed for about 30 seconds to about 300 seconds (e.g., about 90 seconds to about 150 seconds). In one example, the baking process is performed at 180 degrees Celsius for about 120 seconds. The baking process and the hardening process may be performed in the same or different process chamber. In one example, the baking process is performed in the same process chamber where the hardening process is performed.

In some embodiments, which can be combined with any one or more embodiments of the present disclosure, the resist pattern 204' is first exposed to VUV light at an exposure energy of about 100 mJ during the hardening process, and then the resist pattern 204' is heated to a temperature of about 180 degrees Celsius during the baking process to further strengthen the resist pattern 204'. It is contemplated that higher exposure energy of the VUV light, such as about 500 mJ or about 800 mJ, can be used in conjunction with the baking process running at a temperature of about 180 degrees Celsius.

The VUV light may be delivered in various ways to assist or enhance the hardening process. In some embodiments, which can be combined with any one or more embodiments of the present disclosure, the hardening process may be performed by exposing the resist pattern 204' to VUV light having a first exposure energy for a first period of time, followed by exposing the resist pattern 204' to VUV light having a second exposure energy for a second period of time, wherein the second exposure energy may be greater or smaller than the first exposure energy, and the second period of time may be longer or shorter than the first period of time. In some embodiments, which can be combined with any one or more embodiments of the present disclosure, the hardening process may be performed by exposing the resist pattern 204' to VUV light having a first exposure energy for a first period of time, exposing the resist pattern 204' to VUV light having a second exposure energy for a second period of time, and then exposing the resist pattern 204' to VUV light having a third exposure energy and a third period of time, wherein the first exposure energy, second exposure energy, and the third exposure energy are different from each other, and the first period of time, the second period of time, and the third period of time are different from each other. The first exposure energy may be greater or smaller than the second exposure energy, and the second exposure energy may be greater or smaller than the third exposure energy. For example, the resist pattern 204' may be exposed to VUV lights that are emitted at an exposure energy order of low-high-low or high-low-high, and the exposure duration may be performed in the order of long-short-long or short-long-short.

In some embodiments, which can be combined with any one or more embodiments of the present disclosure, the energy source may be configured to deliver pulsed VUV illumination. For example, the VUV light may be provided at a pulse width of 20 nanoseconds to about 1 second, with a duty cycle of about 10% to about 90% (e.g., about 30% to about 60%). The term "duty cycle" used herein refers to the ratio of the pulse width to period between pulses of the VUV light.

Figure 5A:
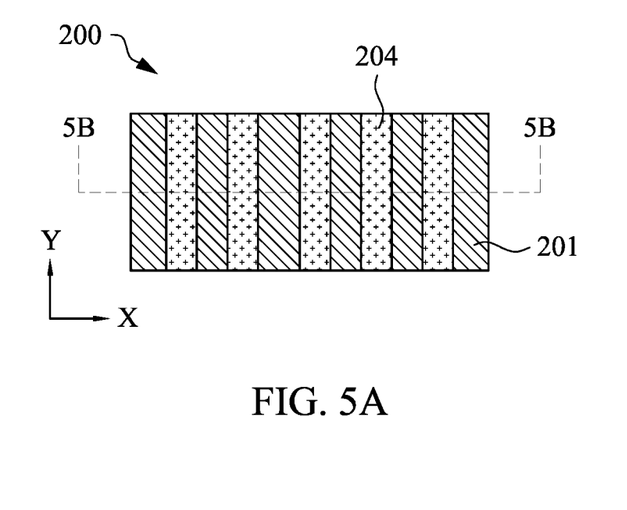
Figure 5B:
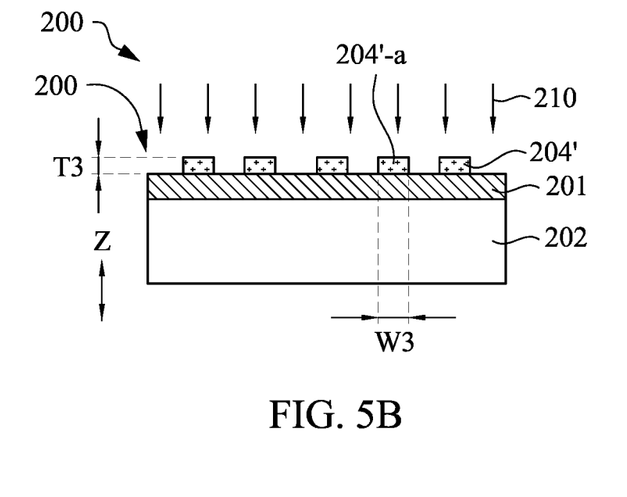

At operation 108, a de-scum process 210 is performed to remove the resist scum 206, as shown in FIGS. 5A and 5B. In some embodiments, the de-scum process 210 is an etching process directed to remove the resist scum 206. The etching process may be any suitable dry etch process, wet etch process, or a combination thereof. In one embodiment, the etching process is performed in an etching chamber using a plasma process, for example an inductively coupled plasma (ICP) process. In such cases, the etching process may use an etching gas including a halogen-containing gas, an oxygen-containing gas, a hydrogen-containing gas, an inert gas, or any combination thereof. In one example, the etching gas includes a halogen-containing gas and an inert gas, such as $CF_4$ and Ar. The halogen-containing gas and the inert gas may each have a flow rate in a range from about 20 standard cubic centimeters per minute (sccm) to about 60 sccm. In some examples, the halogen-containing gas and the inert gas may be introduced into the etching chamber at a flow ratio of about 1:1 to about 3:1. The etching process may be performed at a chamber pressure in a range from about 1 milli-Torr (mT) to about 1 T. A source power for the ICP process may be in a range from about 150 Watts (W) to about 350 W. A bias voltage for the ICP process may be in a range from about 50 Volts (V) to about 250 V. The etching process may be performed for about 10 seconds to about 60 seconds, such as about 30 seconds to about 45 seconds.

Alternative De-Scum Process Example A:

In some embodiments, the de-scum process 210 is a combination of an etching process and an ion bombardment process. The ion bombardment process may be performed prior to the etching process. The ion bombardment process is performed by bombarding the resist scum 206 and the resist pattern 204' with ion species (or other energetic particles), thereby introducing damage into at least the resist scum 206. The damage may include, for example, amorphization of the areas being bombarded, bond breaking/rearrangement, insertion of atoms in the crystal lattice of the resist scum 206, etc. As a result, the material properties of the resist scum 206 are altered and become susceptible to etching to be performed in the subsequent etching process.

The ion species or energetic particles may be formed by excitation of one or more of inert gases such as He, Ne, Ar, Kr, Xe, diatomic gases such as $O_2$, $N_2$, $H_2$, and triatomic gases such as CO2, $N_2O$, $NO_2$, $H_2O$. Other gases, such as halogen-containing gases or hydrogen-containing gases, may also be used. For a resist pattern having a thickness less than 200 Angstroms, the ion energy may range from about 50 eV to about 100 keV, such as about 0.1 keV to about 20 keV, and the ion doses may range from $1\times10^{15}$ ions per cubic centimeter (ions/cm$^3$) to about $2.5\times10^{15}$ ions/cm$^3$. In one embodiment, the ion bombardment process using an ion energy of about 0.7 keV and an ion dose of about $1.4\times10^{15}$ ions/cm$^3$ was performed. The term "dose" used herein refers to the number of ions per unit volume received in a target layer. The etching process following the ion bombardment process may be any suitable dry etch process, wet etch process, or a combination thereof. In embodiments where wet etch process is used, the etchant may include aqueous HF, sodium hydroxide, potassium hydroxide, ammonium hydroxide, tetramethyl ammonium hydroxide (TMAH), hydrogen peroxide, aqueous buffered acetic acid, sulfuric acid, nitric acid, etc. Additionally or alternatively, a dry etch process, such as the etching process used to remove the resist scum 206 as discussed above, may also be used.

Two exemplary embodiments A and B are provided to show scum defects in the resist pattern can be greatly reduced when treating the resist layer with the inventive hardening process and the de-scum process using a combination of an etching process and an ion bombardment process. In the exemplary embodiment A, after the development of a resist layer, the patterned resist layer (e.g., resist pattern 204' in FIG. 3B) was exposed to VUV light emitted at an exposure energy of 100 mJ, followed by a baking process which increases and maintains a temperature of the hardened resist pattern to about 180 degrees Celsius for about 120 seconds. After the VUV exposure and the baking process, a de-scum process was performed by first subjecting the hardened resist pattern to an ion bombardment process using an ion energy of about 0.7 keV and an ion dose of about $1.4\times10^{15}$ ions/cm$^3$, and then subjecting the ion bombarded resist pattern to an etching process (either a dry etch or wet etch). The counts of scum defect in the VUV treated resist pattern is about 412. In the meantime, a reference resist pattern (having the same narrowest width (usually called critical dimension (CD)) as the resist pattern 204' in FIG. 3B) that was not treated with the inventive hardening process but de-scummed by the same ion bombardment process (except an ion dosage of $1\times10^{15}$ ions/cm$^3$ was used) and the same etching process, shows the scum defect counts of about 490. Comparing to the reference resist pattern, the higher ion dosage used in the exemplary embodiment A is shown to help reduce scum defects of the VUV treated resist pattern by 16%.

In the exemplary embodiment B, a hardening process identical to the hardening process in the exemplary embodiment A was performed on a patterned resist layer (e.g., resist pattern 204' in FIG. 3B). Then a de-scum process identical to the de-scum process used in the exemplary embodiment A (except the etching time is about 20% longer) was performed on the VUV treated resist pattern, resulting in scum defect counts of about 443. In the meantime, a reference resist pattern (having the same critical dimension as the resist pattern 204' in FIG. 3B) that was not treated with the inventive hardening process but de-scummed by the same ion bombardment process and the same etching process, shows the scum defect counts of about 547. Comparing to the reference resist pattern, the longer etching time used in the exemplary embodiment B is shown to help reduce scum defects of the VUV treated resist pattern by 19%.

Alternative De-Scum Process Example B:

In some embodiments, the de-scum process 210 is an etching process directed to remove the material layer 201, such as the etching process performed at operation 110. Since the resist scum 206 is formed on the material layer 201, the removal of the material layer 201 will also remove the resist scum 206 together. The etching process may be any suitable dry etch process, wet etch process, or a combination thereof. The etching process can be an anisotropic etch process or a selective etch process that have a high selectivity of the material layer 201, with a minimal etching effect on the resist pattern 204'. The etching chemistry used in the selective etch process may vary depending on the composition of the material layer 201. For example, in embodiments where the material layer 201 is a hard mask layer made of oxides, a plasma formed from a gas mixture comprising nitrogen, hydrogen, and fluorine may be used to remove the material layer 201 and the resist scum 206. The plasma etch may be performed for about 5 seconds to about 40 seconds, such as about 10 seconds to about 30 seconds. In one example, the plasma etch is performed for about 17 seconds.

In some embodiments, the etching process in the alternative de-scum process example B is combined with the ion bombardment process used in the alternative de-scum process example A. That is, after subjecting the hardened resist pattern to the ion bombardment process, an etching process directed to remove the material layer 201 can be performed to remove the scum defects along with the material layer.

Figure 6A:
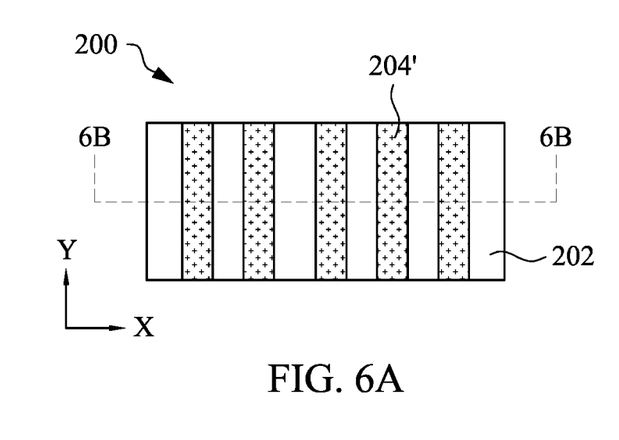
Figure 6B:
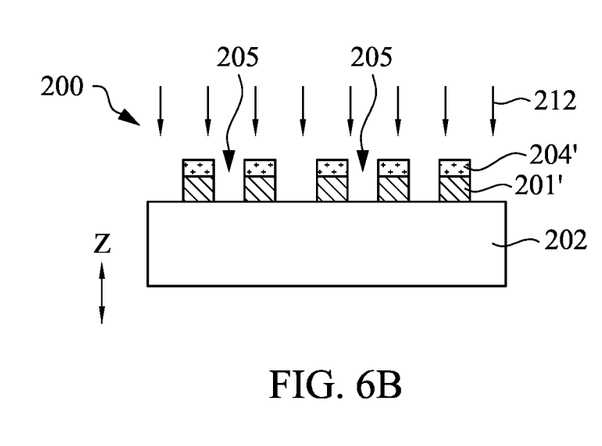
Figure 7A:
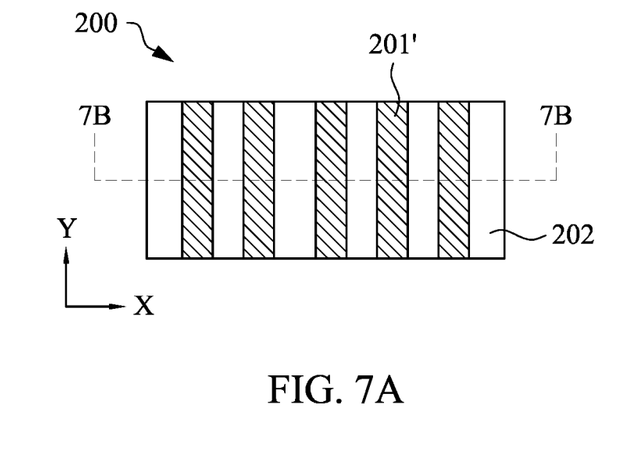
Figure 7B:
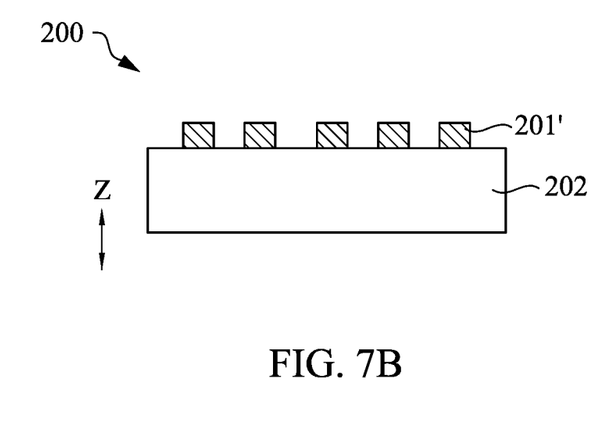

At operation 110, a fabrication process 212 is performed on workpiece 200, such as on the material layer 201, using the de-scummed, hardened resist pattern 204' as a mask. For example, the fabrication process 212 is applied only to portions of the workpiece 200 within openings 205 of the hardened resist pattern 204', while other portions of the workpiece 200 covered by the hardened resist pattern 204' are protected from being impacted by the fabrication process in some embodiments. In some embodiments, the fabrication process includes performing an etching process on the material layer 201 using the hardened resist pattern 204' as an etching mask. A pattern is thus transferred from the hardened resist pattern 204' to the material layer 201, thereby forming the patterned material layer 201', as shown in FIGS. 6A and 6B. In embodiments where the material layer 201 is a hard mask layer, the pattern is first transferred from the hardened resist pattern 204' to the material layer 201, and then the pattern is transferred from patterned material layer 201' to a material layer of the wafer 202. The etching process may be a dry etching process, a wet etching process, other suitable etching process, or combinations thereof. Alternatively, in some embodiments, the fabrication process includes performing an implantation process on the material layer 201 using the hardened resist pattern 204' as an implant mask, thereby forming various doped features (regions) in the material layer 201, e.g., in the regions not covered by the hardened resist pattern 204'.

At operation 112, the hardened resist pattern 204' is removed from the workpiece 200 using any suitable process, such as a resist stripping process, leaving the patterned material layer 201' disposed over the wafer 202. In some embodiments, the patterned resist layer 204' may be partially consumed during the fabrication process, such as during the etching process, such that any remaining portion of the patterned resist layer 204' is subsequently removed by the resist stripping process.

Various embodiments of the present disclosure provide a hardened resist layer by subjecting the resist layer to VUV light and baking process. The resist layer is hardened with increased mechanical strength and etch resistivity, allowing the process window of the ion bombardment and etching process (i.e., the de-scum process 210) to broaden and be used to remove scum defects (e.g., resist scum 206) without forming broken lines in the resist pattern 204'. In some cases, the VUV treatment and optional baking process can improve the ion bombardment and/or etch budget by 25%-35%, as will be discussed in Examples A-L below. The hardening effects of the resist layer can be recognized through a comparison of film thickness between a hardened resist layer (e.g., hardened resist pattern 204' in FIG. 4B) and a patterned resist layer (e.g., resist pattern 204' in FIG. 3B) that is not treated with the inventive hardening process (hereinafter the "reference resist layer"). Measurements of the film thickness are performed at different stages: (1) after development of the resist layer (e.g., after operation 104 and prior to operation 106); (2) after hardening process (e.g., after operation 106 and prior to operation 108); and (3) after de-scum process (e.g., after operation 108 and prior to operation 110). As will be discussed in various Examples below, the comparison shows film thickness loss of the hardened resist layer with respect to the patterned resist layer at different stages (1) to (3) and can be used to demonstrate the hardened resist layers having etch resistivity and/or ion bombardment resistance sufficient to withstand heavier or longer de-scum process without broken line issues.

Example A

In one embodiment, after development of a resist layer, a first film thickness measurement was performed on the patterned resist layer (e.g., resist pattern 204' shown in FIG. 3B) to obtain a thickness T1. The patterned resist layer was then exposed to VUV light emitted at an exposure energy of 100 mJ to become a hardened resist layer (e.g., resist pattern 204' shown in FIG. 4B). After the VUV exposure, a second film thickness measurement was performed on the hardened resist layer to obtain a thickness T2. The thickness T2 is about 24.1 percent of the thickness T1, suggesting that the VUV light results in about 24.1 percent film loss of the patterned resist layer. A de-scum process using an etching process, such as the above-mentioned etching process used to remove scum defects at operation 108, was performed on the hardened resist layer. Then, a third film thickness measurement was performed on the de-scummed resist layer (e.g., resist pattern 204' shown in FIG. 5B) to obtain a thickness T3. The thickness T3 is about 5.1 percent of the thickness T2, suggesting that the de-scum process using the etching process to remove the scum defects results in about 5.1 percent film loss of the hardened resist layer.

Example B

In another embodiment, the resist layer had gone through the same processes discussed in Example A except that the patterned resist layer was exposed to VUV light emitted at an exposure energy of 500 mJ. The thickness T2 measured after the VUV exposure is about 31.8 percent of the thickness T1, suggesting that the VUV light emitted at higher exposure energy results in about 31.8 percent film loss of the patterned resist layer. In addition, the thickness T3 measured after the de-scum process, such as the above-mentioned etching process used to remove scum defects (e.g., resist scum 206), is about 2.2 percent of the thickness T2, suggesting that the de-scum process results in about 2.2 percent film loss of the hardened resist layer. Comparing to Example A, while higher exposure energy of the VUV light may cause greater film loss of the patterned resist layer, the film loss by the de-scum process is less due to the greater etch resistivity provided by the hardened resist layer.

Example C

A film thickness measurement was performed on a reference resist layer (i.e., patterned resist layer that is not treated with the inventive hardening process) that was developed and then subjected to the same de-scum process (e.g., etching process used in Examples A and B) to obtain a thickness T4. The thickness T4 is about 25.9 percent of the thickness T1, suggesting that the patterned reference resist layer (e.g., resist pattern 204' shown in FIG. 3B) would suffer greater film loss by the de-scum process when not treating with the inventive hardening process. It has been observed that the film loss of the reference resist layer after the de-scum process is about 39.5 percent, while the film loss of the hardened resist layer (treated with VUV light emitted at 100 mJ) after the de-scum process is about 7.8 percent, and the film loss of the hardened resist layer (treated with VUV light emitted at 500 mJ) after the de-scum process is about 3.4 percent. Comparing to the reference resist layer, the de-scum loss of the hardened resist layer treated with VUV light emitted at 100 mJ is improved by at least 80 percent, and the de-scum loss of the hardened resist layer treated with VUV light emitted at 500 mJ is improved by at least 91.3 percent.

Similar film loss improvement was also observed with the de-scum process using a combination of an etching process and an ion bombardment process. Examples below show film thickness loss of hardened resist layers with respect to the patterned resist layer measured at different stages (1) to (3) above, wherein the de-scum process is a combination of an etching process and an ion bombardment process (such as the de-scum process 210 discussed above at operation 108). Examples D-H demonstrate the hardened resist layer having etch resistivity sufficient to withstand heavier or longer de-scum process without broken line issues.

Example D

In one embodiment, after development of a resist layer, a first film thickness measurement was performed on the patterned resist layer (e.g., resist pattern 204' shown in FIG. 3B) to obtain a thickness T1. The patterned resist layer was then exposed to VUV light emitted at an exposure energy of 100 mJ to become a hardened resist layer (e.g., resist pattern 204' shown in FIG. 4B). After the VUV exposure, a second film thickness measurement was performed on the hardened resist layer to obtain a thickness T2. The thickness T2 is about 21 percent of the thickness T1, suggesting that the VUV light results in about 21 percent film loss of the patterned resist layer. A de-scum process using a combination of an etching process and an ion bombardment process (such as the de-scum process 210 discussed above at operation 108), was performed on the hardened resist layer. In one aspect, an ion bombardment process using an ion energy of about 0.7 keV and an ion dose of about $1.4 \times 10^{15}$ ions/cm$^3$ was used. A third film thickness measurement was then performed on the de-scummed resist layer (e.g., resist pattern 204' shown in FIG. 5B) to obtain a thickness T3. The thickness T3 is about 22 percent of the thickness T2, suggesting that the de-scum process using the combination of an etching process and an ion bombardment process results in about 22 percent film loss of the hardened resist layer.

Example E

In another embodiment, the resist layer had gone through the same processes discussed in Example D except that the patterned resist layer was exposed to VUV light emitted at an exposure energy of 500 mJ. The thickness T2 measured after the VUV exposure is about 33 percent of the thickness T1, suggesting that the VUV light emitted at higher exposure energy results in about 33 percent film loss of the patterned resist layer. In addition, the thickness T3 measured after the de-scum process, such as the combination of an etching process and an ion bombardment process discussed above at operation 108, is about 11 percent of the thickness T2, suggesting that the de-scum process results in about 11 percent film loss of the hardened resist layer.

Example F

In one another embodiment, the resist layer had gone through the same processes discussed in Example E except that the patterned resist layer was exposed to VUV light emitted at an exposure energy of 800 mJ. The thickness T2 measured after the VUV exposure is about 36 percent of the thickness T1, suggesting that the VUV light emitted at higher exposure energy results in about 36 percent film loss of the patterned resist layer. In addition, the thickness T3 measured after the de-scum process, such as the combination of an etching process and an ion bombardment process discussed above at operation 108, is about 10.8 percent of the thickness T2, suggesting that the de-scum process results in about 10.8 percent film loss of the hardened resist layer. As can be seen in Examples E, D, and F, while higher exposure energy of the VUV light may cause greater film loss of the patterned resist layer, the film loss by the de-scum process is decreasing due to the greater etch resistivity and improved ion bombardment resistance provided by the hardened resist layer.

Example G

In yet another embodiment, the resist layer had gone through the same processes discussed in Example D except that, after the VUV exposure, the hardened resist layer was further subjected to a baking process. The baking process heated the hardened resist layer and maintained the temperature at about 180 degrees Celsius for about 120 seconds to further strengthen or condense the hardened resist layer. Thereafter, a second film thickness measurement was performed on the hardened resist layer to obtain a thickness T2. The thickness T2 is about 30 percent of the thickness T1, suggesting that the VUV light and the extra baking process result in about 30 percent film loss of the patterned resist layer. In addition, the thickness T3 measured after the de-scum process, such as the combination of an etching process and an ion bombardment process discussed above at operation 108, is about 9.4 percent of the thickness T2, suggesting that the de-scum process results in about 9.4 percent film loss of the hardened resist layer.

Example H

A film thickness measurement was performed on a reference resist layer (i.e., patterned resist layer that is not treated with the inventive hardening process) that was developed and then subjected to the same de-scum process (e.g., the de-scum process used in Examples D-G) to obtain a thickness T4. The thickness T4 is about 27.4 percent of the thickness T1, suggesting that the patterned reference resist layer (e.g., resist pattern 204' shown in FIG. 3B) would suffer greater film loss by the de-scum process when not treating with the inventive hardening process. Comparing to the reference resist layer, the de-scum loss (or ion bombardment resistance) of the hardened resist layer in Examples D, E, F, and G is improved by 19%, 60%, 60%, and 67%, respectively.

Noted that the increase of ion exposure energy from 100 mJ (Example D) to 500 mJ (Example E) can improve the ion bombardment resistance by 41%, and the extra baking process (Example G) can improve the ion bombardment resistance by 48% even the ion exposure energy remains the same. However, no significant improvement of ion bombardment resistance was noticed when increasing the ion exposure energy from 500 mJ to 800 mJ.

Likewise, similar film loss improvement was also observed with the de-scum process using an etching process directed to remove an underlying layer (e.g., material layer 201 in FIG. 5B). Examples below show film thickness loss of hardened resist layers with respect to the patterned resist layer measured at different stages (1) to (3) above, wherein the de-scum process is an etching process directed to remove the material layer (such as the de-scum process 210 discussed above at operation 108). Examples I-L demonstrate the hardened resist layer having etch resistivity sufficient to withstand heavier or longer de-scum process without broken line issues.

Example I

In one embodiment, after development of a resist layer, a first film thickness measurement was performed on the patterned resist layer (e.g., resist pattern 204' shown in FIG. 3B) to obtain a thickness T1. The patterned resist layer was then exposed to VUV light emitted at an exposure energy of 100 mJ to become a hardened resist layer (e.g., resist pattern 204' shown in FIG. 4B). After the VUV exposure, a second film thickness measurement was performed on the hardened resist layer to obtain a thickness T2. The thickness T2 is about 25 percent of the thickness T1, suggesting that the VUV light results in about 25 percent film loss of the patterned resist layer. A de-scum process using an etching process directed to remove a material layer (e.g., the material layer 201 in FIG. 4B), such as the de-scum process 210 discussed above at operation 108, was performed on the hardened resist layer. Then, a third film thickness measurement was performed on the de-scummed resist layer (e.g., resist pattern 204' shown in FIG. 5B) to obtain a thickness T3. The thickness T3 is about 21.2 percent of the thickness T2, suggesting that the de-scum process using the etching process to remove the material layer results in about 21.2 percent film loss of the hardened resist layer.

Example J

In another embodiment, the resist layer had gone through the same processes discussed in Example 1 except that the patterned resist layer was exposed to VUV light emitted at an exposure energy of 500 mJ. The thickness T2 measured after the VUV exposure is about 32 percent of the thickness T1, suggesting that the VUV light emitted at higher exposure energy results in about 32 percent film loss of the patterned resist layer. In addition, the thickness T3 measured after the de-scum process, such as the above-mentioned etching process used to remove the material layer 201 at operation 108, is about 16.9 percent of the thickness T2, suggesting that the de-scum process results in about 16.9 percent film loss of the hardened resist layer. Comparing to Example I, while higher exposure energy of the VUV light may cause greater film loss of the patterned resist layer, the film loss by the de-scum process is less due to the greater etch resistivity provided by the hardened resist layer.

Example K

In yet another embodiment, the resist layer had gone through the same processes discussed in Example 1 except that, after the VUV exposure, the hardened resist layer was further subjected to a baking process. The baking process heated the hardened resist layer and maintained the temperature at about 180 degrees Celsius for about 120 seconds to further strengthen or condense the hardened resist layer. Thereafter, a second film thickness measurement was performed on the hardened resist layer to obtain a thickness T2. The thickness T2 is about 31 percent of the thickness T1, suggesting that the VUV light and the extra baking process result in about 31 percent film loss of the patterned resist layer. In addition, the thickness T3 measured after the de-scum process, such as the above-mentioned etching process used to remove the material layer 201 at operation 108, is about 15.5 percent of the thickness T2, suggesting that the de-scum process results in about 15.5 percent film loss of the hardened resist layer.

Example L

A film thickness measurement was performed on a reference resist layer (i.e., patterned resist layer that is not treated with the inventive hardening process) that was developed and then subjected to the same de-scum process (e.g., the de-scum process used in Examples J-K) to obtain a thickness T4. The thickness T4 is about 42.2 percent of the thickness T1, suggesting that the patterned reference resist layer (e.g., resist pattern 204' shown in FIG. 3B) would suffer greater film loss by the de-scum process when not treating with the inventive hardening process. Comparing to the reference resist layer, the de-scum loss (or etch resistance) of the hardened resist layer in Examples I, J, and K is improved by 49%, 60%, and 63%, respectively.

The hardening effect of the resist layer may also be recognized through a comparison of end-to-end (EtE) width (e.g., critical dimension) of each resist segment between VUV treated and untreated resist patterns. Since the VUV treatment strengthens and reduces the critical dimension of the resist segments, the reduction of EtE width of each resist segments (e.g., "W1" of the resist segments 204'-a shown in FIG. 3B) can be used to determine the improvement of etch resistivity and/or ion bombardment resistance of the resist pattern when comparing VUV treated and untreated resist patterns. In the Examples below, comparisons of EtE width of resist segments are performed on VUV treated and untreated resist patterns at different stages: (1) after development of the resist layer (e.g., after operation 104 and prior to operation 106); (2) after hardening process (e.g., after operation 106 and prior to operation 108); and (3) after de-scum process (e.g., after operation 108 and prior to operation 110). The reduction of EtE width of each resist segment is determined by comparing 2-dimensional (2D) images (e.g., SEM images) of the VUV treated and untreated resist patterns.

Example M

In one embodiment, after development of a resist layer, a first 2-dimensional (2D) image (e.g., SEM images) of the patterned resist layer (e.g., resist pattern 204' shown in FIG. 3B) was taken to obtain an EtE width W1 (e.g., critical dimension of the resist segments 204'-a in FIG. 3B). The patterned resist layer was then exposed to VUV light emitted at an exposure energy of 100 mJ, followed by a baking process heating and maintaining the hardened resist layer (e.g., resist pattern 204' shown in FIG. 4B) at about 180 degrees Celsius. After the VUV exposure, a second 2D image of the hardened resist layer was taken to obtain an EtE width W2 (e.g., critical dimension of the resist segments 204'-a in FIG. 4B). The EtE width W2 is about 32.7 percent of the EtE width W1, suggesting that the VUV light results in about 32.7 percent reduction of EtE width of the patterned resist layer. A de-scum process, such as the de-scum process 210 using a combination of an etching process and an ion bombardment process discussed above at operation 108, was performed on the hardened resist layer. In one aspect, the ion bombardment process using an ion energy of about 0.7 keV and an ion dose of about $1.4 \times 10^{15}$ ions/cm$^3$ was performed. Then, a third 2D image of the de-scummed resist layer was taken to obtain an EtE width W3 (e.g., critical dimension of the resist segments 204'-a in FIG. 5B). The EtE width W3 is about 5.6 percent of the EtE width W2, suggesting that the de-scum process using the combination of an etching process and an ion bombardment process results in about 5.6 percent reduction of EtE width of the hardened resist layer.

Example N

A 2D image of a reference resist pattern (e.g., a resist layer that was developed and then subjected to the same de-scum process used in Example M) was taken to obtain an EtE width W4. The EtE width W4 is about 33.3 percent of the EtE width W1, suggesting that the reference resist pattern (e.g., resist pattern 204' shown in FIG. 3B) would suffer greater amount of film loss by the de-scum process when not treated with the inventive hardening process. Comparing to the reference resist pattern, the de-scum loss of the hardened resist layer in Example M is improved by 40%, allowing higher ion bombardment dosage to be used in the de-scum process.

Figure 8:
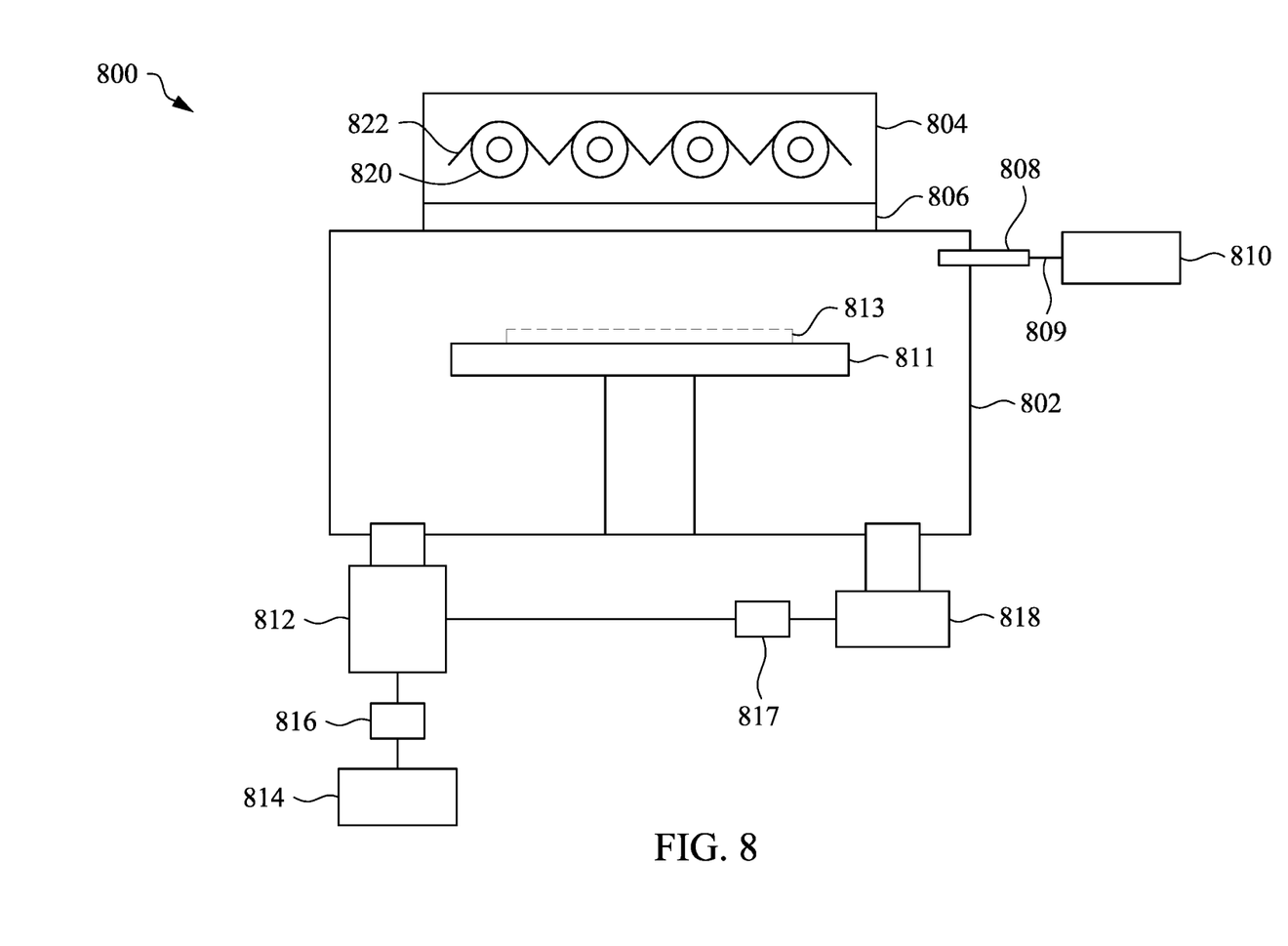
FIG. 8 illustrates an exemplary irradiation system that may be used to practice various embodiments of the present disclosure.

FIG. 8 illustrates an exemplary irradiation system 800 that may be used to practice various embodiments of the present disclosure. For example, the irradiation system 800 can be used to perform operation 106 as described above in FIG. 1. The irradiation system 800 generally includes a chamber body 802, an irradiation source 804, an irradiation window 806 disposed between the chamber body 802 and the irradiation source 804, a gas inlet 808 provided at the wall of the chamber body 802 and connected to a gas source 810 through a gas supply line 809, a heater 811 for supporting a workpiece 813 (such as the workpiece 200 discussed above in FIGS. 2A-7B), a first vacuum pump 812 connecting the chamber body 802 to an exhaust port 814, a first pressure control valve 816 disposed between the first vacuum pump 812 and the exhaust port 814, a second vacuum pump 818 connecting the chamber body 802 to the first vacuum pump 812, and a second pressure control valve 817 disposed between the first vacuum pump 812 and the second vacuum pump 818. The irradiation source 804 is an energy source that is capable of producing ultraviolet (UV) light in a wavelength range from 200 nm to 400 nm, far-UV light in a wavelength range from 10 nm to 200 nm, or vacuum UV (VUV) light with a wavelength of about 200 nm or below, such as from 80 nm to 200 nm, that is suitable for performing the hardening process 208 discussed in operation 106 of FIG. 1.

The heater 811 is disposed within the chamber body 802 and facing and in parallel with the irradiation source 804. The heater 811 can be actuated to move vertically and adjust the distance between the heater 811 and the irradiation window 806. The irradiation window 806 isolates the chamber body 802 from the atmosphere and can be used to transmit light in a uniform manner. The irradiation source 804 may have multiple tubular lamps 820 arranged in parallel. The irradiation source 804 can be operated to emit light (e.g., VUV lights) continuously or in pulses. A reflection plate 822 is provided to guide the light emitted from each tubular lamp 820 to be properly reflected onto the workpiece 813.

The internal pressure of the chamber body 802 can be controlled over a range from vacuum to near atmospheric pressure using the first and second vacuum pumps 812, 818. The first vacuum pump 812 may be a dry pump or the like. The second vacuum pump 818 may be a turbo pump or the like. The first and second vacuum pumps 812, 818 allow the internal pressure of the chamber body 802 to be operated at a range from about 1000 Pa to about 100000 Pa, or any pressure range suitable for performing the operation 106 discussed above in FIG. 1.

The present disclosure in various embodiments provides a hardened resist layer that can reduce resist scum defects in a resist layer. The hardened resist layer is formed by subjecting the resist layer to VUV light and baking process after the development of the resist layer and prior to the de-scum process. The hardened resist layer has increased etch resistivity and ion bombardment resistance, allowing enhanced etching/de-scum process to remove more resist scum defects without suffering broken defect. In most cases, the VUV treatment and baking process improve the ion bombardment and/or etch budget by at least 25%-35%.

The present disclosure in various embodiments provides a hardened resist layer that can reduce resist scum defects in a resist layer. In one embodiment, a lithography method is provided. The method includes forming a resist layer over a substrate, performing an exposure process on the resist layer, performing a developing process on the resist layer to form a patterned resist layer having a plurality resist segments, exposing the patterned resist layer to a vacuum ultraviolet (VUV) radiation, and subjecting the resist pattern to a de-scum process.

In another embodiment, a lithography method is provided. The method includes performing a developing process on a resist layer to form a patterned resist layer having a plurality resist segments, wherein each resist segment has a first critical dimension after the developing process, exposing the patterned resist layer to a photon radiation having a wavelength of 400 nm or below, wherein each resist segment has a second critical dimension after exposing the patterned resist layer to the photon radiation, and the second critical dimension is smaller than the first critical dimension, bombarding the patterned resist layer with energetic particles directed to remove a resist scum extending from the patterned resist layer, wherein each resist segment has a third critical dimension after the bombardment process, and the third critical dimension is smaller than the second critical dimension, and performing an etching process on the patterned resist layer.

In yet another embodiment, a lithography method is provided. The method includes forming a patterned resist layer over a substrate, wherein the patterned resist layer has a plurality resist segments, hardening the patterned resist layer in a vacuum chamber by exposing the patterned resist layer to a vacuum ultraviolet (VUV) light, wherein the patterned resist layer has a reduced critical dimension after the VUV exposure, and performing an etching process directed to remove a material layer disposed below the patterned resist layer, wherein the material layer is etched using the patterned resist layer as a mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A lithography method, comprising:
   forming a resist layer over a substrate;
   performing an exposure process on the resist layer;
   performing a developing process on the resist layer to form a patterned resist layer having a plurality resist segments and a resist scum protruding from sidewalls of the resist segments and extending between two adjacent resist segments, wherein the resist scum is exposed to an exposure light at the exposure process;
   hardening the patterned resist layer including the resist scum by exposing the patterned resist layer to a vacuum ultraviolet (VUV) radiation, the hardening comprising:
      exposing the patterned resist layer to a first vacuum ultraviolet (VUV) radiation having a first exposure energy;
      exposing the patterned resist layer to a second VUV radiation having a second exposure energy that is different than the first exposure energy; and
   after exposing the patterned resist layer to the VUV radiation, subjecting the resist pattern to a de-scum process that is substantially free of VUV radiation to remove the resist scum.

2. The method of claim 1, further comprising:
   after exposing the patterned resist layer to VUV radiation, heating the patterned resist layer from a first temperature to a second temperature that is greater than the first temperature.

3. The method of claim 1, wherein the VUV radiation is emitted at an exposure energy directed to reduce a critical dimension of each resist segment.

4. The method of claim 1, wherein exposing the patterned resist layer to a VUV radiation is performed under vacuum condition.

5. The method of claim 1, wherein the de-scum process further comprises:
   performing an ion bombardment process on the patterned resist layer.

6. The method of claim 5, wherein the de-scum process further comprises:
   after the ion bombardment process, performing an etching process on the patterned resist layer to remove the resist scum.

7. The method of claim 1, wherein the de-scum process is an etching process directed to remove the resist scum.

8. The method of claim 1, wherein the de-scum process is an etching process directed to remove a material layer disposed below the patterned resist layer.

9. The method of claim 1, wherein the resist layer is a metal-containing photoresist.

10. The method of claim 1, wherein the resist layer is a tri-layer photoresist.

11. The method of claim 1, wherein the VUV radiation is emitted at a plurality of pulses.

12. A lithography method, comprising:
    performing an exposure process on a resist layer over a substrate;
    performing a developing process on the resist layer to form a patterned resist layer having a plurality resist segments and a resist scum protruding from sidewalls of the resist segments and extending between two adjacent resist segments, wherein the resist scum is exposed to an exposure light at the exposure process, and wherein each resist segment has a first critical dimension after the developing process;
    hardening the patterned resist layer by exposing the patterned resist layer to a photon radiation having a wavelength of 400 nm or below, wherein each resist segment has a second critical dimension after exposing the patterned resist layer to the photon radiation, and the second critical dimension is smaller than the first critical dimension, wherein exposing the patterned resist layer to a photon radiation comprises:
       exposing the patterned resist layer to the photon radiation having a first exposure energy; and
       exposing the patterned resist layer to a second photon radiation having a second exposure energy that is different than the first exposure energy;
    after exposing the patterned resist layer to the photon radiation, bombarding the patterned resist layer with energetic particles in an environment that is substantially free of VUV light to remove the resist scum, wherein each resist segment has a third critical dimension after the bombardment process, and the third critical dimension is smaller than the second critical dimension; and
    performing an etching process on the patterned resist layer.

13. The method of claim 12, wherein the photon radiation is generated by striking a plasma formed from a gas mixture comprising an inert gas.

14. The method of claim 13, wherein exposing the patterned resist layer to a photon radiation is performed under vacuum condition.

15. The method of claim 12, further comprising:
    after exposing the patterned resist layer to the photon radiation, heating the patterned resist layer from a first temperature to a second temperature that is greater than the first temperature.

16. The method of claim 12, wherein the resist layer is a metal oxide based photoresist.

17. A lithography method, comprising:
    performing an exposure process on a resist layer over a substrate;
    forming a patterned resist layer, wherein the patterned resist layer has a plurality resist segments and a resist scum protruding from sidewalls of the resist segments and extending between two adjacent resist segments, wherein the resist scum is exposed to an exposure light at the exposure process;
    hardening the patterned resist layer in a vacuum chamber by exposing the patterned resist layer to a vacuum ultraviolet (VUV) light, wherein the VUV light maintains the resist scum, and the patterned resist layer has a reduced critical dimension after the VUV exposure, wherein exposing the patterned resist layer to the VUV light further comprises:

exposing the patterned resist layer to a first vacuum ultraviolet (VUV) radiation having a first exposure energy; and exposing the patterned resist layer to a second VUV radiation having a second exposure energy, wherein the first exposure energy is different than the second exposure energy;

after hardening the patterned resist layer, performing an ion bombardment process on the patterned resist layer in an environment that is substantially free of VUV light to remove the resist scum; and performing an etching process directed to remove a material layer disposed below the patterned resist layer, wherein the material layer is etched using the patterned resist layer as a mask.

18. The method of claim 17, further comprising:

after hardening the patterned resist layer, performing a baking process on the patterned resist layer to heat the patterned resist layer from a first temperature to a second temperature that is greater than the first temperature.

19. The method of claim 17, wherein the resist layer is a metal-containing photoresist.

20. The method of claim 17, wherein the first VUV radiation is performed for a first period of time, the second VUV radiation is performed for a second period of time that is different from the first period of time.

* * * * *